(12) United States Patent
Bosnyak et al.

(10) Patent No.: US 6,526,552 B1
(45) Date of Patent: Feb. 25, 2003

(54) LONG LINE RECEIVER FOR CMOS INTEGRATED CIRCUITS

(75) Inventors: Robert J. Bosnyak, San Jose, CA (US); Jose M. Cruz, Palo Alto, CA (US); Robert J. Drost, Mountain View, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 64 days.

(21) Appl. No.: 09/696,451

(22) Filed: Oct. 25, 2000

(51) Int. Cl.[7] .................................................. G06F 9/45
(52) U.S. Cl. ................................... 716/6; 716/6; 716/5
(58) Field of Search ............................... 716/6.5; 326/30, 326/86, 87; 327/312

(56) References Cited

U.S. PATENT DOCUMENTS

| | | | | |
|---|---|---|---|---|
| 5,124,578 A | * | 6/1992 | Worley et al. ............... 257/358 |
| 5,465,255 A | * | 11/1995 | Tanaka et al. ............... 370/216 |
| 5,488,705 A | * | 1/1996 | LaBarbera ................... 359/115 |
| 5,818,782 A | * | 10/1998 | Kotani et al. ............... 365/226 |
| 5,994,919 A | * | 11/1999 | Jain ............................. 326/30 |
| 6,038,188 A | * | 3/2000 | Akamatsu ............... 365/189.06 |
| 6,184,717 B1 | * | 2/2001 | Crick ........................... 326/21 |
| 6,275,088 B1 | * | 8/2001 | Jain ............................. 326/30 |
| 6,351,171 B1 | * | 2/2002 | Balhiser ...................... 327/318 |

\* cited by examiner

*Primary Examiner*—Vuthe Siek
*Assistant Examiner*—Binh Tat
(74) *Attorney, Agent, or Firm*—Townsend and Townsend and Crew LLP

(57) ABSTRACT

A clamping circuit which is connected to each long line, preferably adjacent the receiver. The clamping circuit biases the long line at the trigger threshold of the receiver. Thus, instead of amplifying the signal as a repeater will do, the present invention clamps the line to the threshold, thus allowing a faster response since the line doesn't have to be charged or discharged from a lower or higher level to the threshold. This thus speeds up the transition at the receiver without requiring a repeater or a keeper.

11 Claims, 6 Drawing Sheets

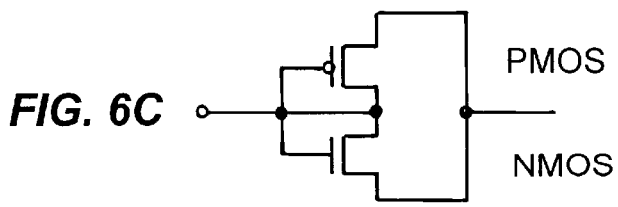
FIG. 6C — PMOS / NMOS
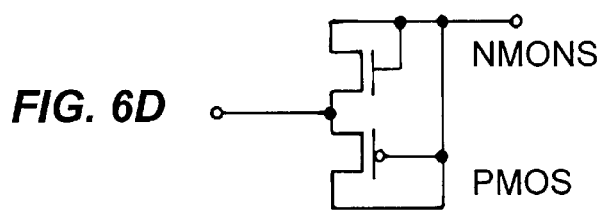
FIG. 6D — NMONS / PMOS
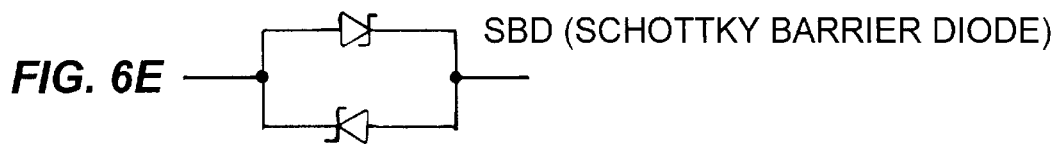
FIG. 6E — SBD (SCHOTTKY BARRIER DIODE)
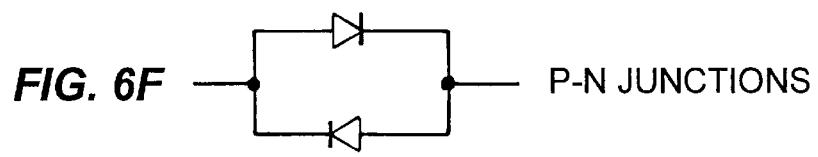
FIG. 6F — P-N JUNCTIONS
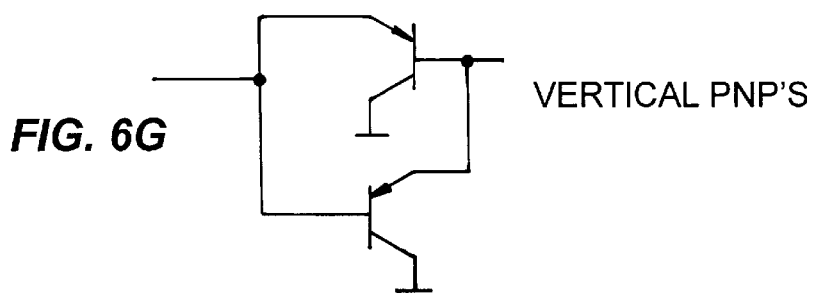
FIG. 6G — VERTICAL PNP'S
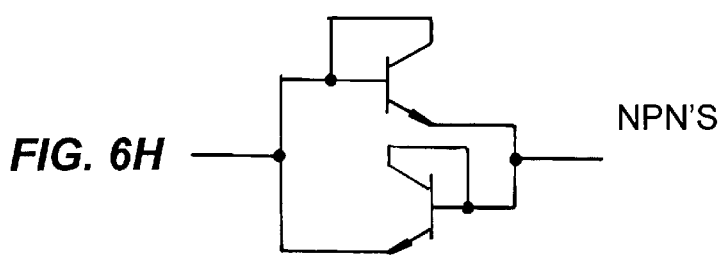
FIG. 6H — NPN'S

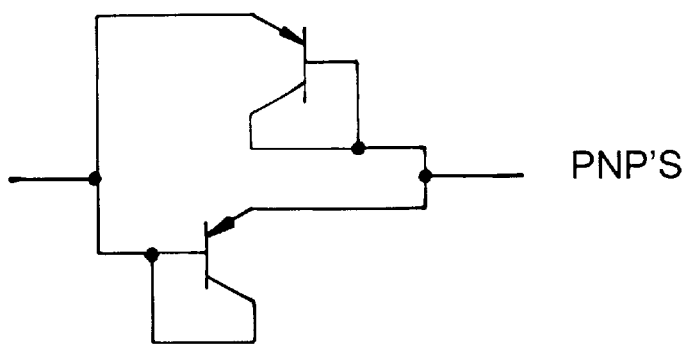
FIG. 6I                                              PNP'S
FIG. 6J    CENTER BIASED NMOS
FIG. 6K    CENTER BIASED PMOS
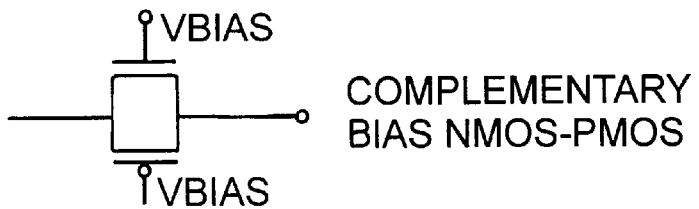
FIG. 6L    COMPLEMENTARY BIAS NMOS-PMOS

LONG LINE RECEIVER FOR CMOS INTEGRATED CIRCUITS

BACKGROUND OF THE INVENTION

The present invention relates to repeater circuits in very large scale integration (VLSI) circuits, and in particular to a replacement for repeaters which reduces signal transition delay on long lines.

In today's high frequency VLSI chips, delays through both active gates and wires have become equally important in determining the total critical speed path delay. As process technology and supply voltage are scaled, the active gate delay comes down quickly. The gate delay can fall into the sub nano-second range easily with today's advanced processes and scaled supply voltages. On the other hand, wire delay does not scale well due to the increased coupling capacitance and the increased series resistance in finer wires. Inductance also becomes significant with newer processes.

The use of repeaters or buffers in long wires can alleviate this delay problem. The RC time constant of a long wire follows the square rule relationship with its length. Doubling the wire length quadruples the delay time at the end of the wire. On the other hand, the delay is only doubled when compared to the original wire delay (plus any added repeater gate delay) with the insertion of a repeater at the mid-point. This is an improvement in delay time when compared to the case without the use of repeaters.

Repeaters have been used recently in high frequency chip design to resolve the long wire delay problem. The procedure can be described as follows: with an existing routed chip, all long signal wires are analyzed and identified for critical nets. This can be done using a SPICE program to simulate the signal net with the proper lumped RC model. Once repeater placement is identified, they can be inserted in the signal line where they are needed. The repeater cell can reside in a standard cell block, in a data path block, or in a stand-alone repeater block. However, they all occupy extra spaces in the layout.

In a high frequency VLSI chip running above 500 Mhz the required number of repeaters is quite significant. It was estimated that more than 15,000 repeaters are needed for a chip with die size of 18 mm×18 mm, compared to a few hundred for a 200 Mhz or less chip.

The repeaters are essentially dedicated buffers which can be located at different positions on the chip. When a repeater is needed, the wire position where it is needed is broken and routed to the repeater and back. The estimated wire distance between each repeater is about 4 mm for the 500 Mhz chip. Depending on how close the repeater block happens to be, this additional wire routing can add additional delays.

Addition of repeaters is typically a heuristic activity that creates re-working of a circuit layout and a re-evaluation of the impact in a logic negation (since an inverter adds a logic inversion) and timing (since the inverter itself adds its intrinsic delay as well as amplification). Hence a hardware means that could help reconstitute the signal without inversion and without additional delay would help resolve this problem.

FIG. 1A is a diagram of a typical computer system in which repeaters or other mechanisms may be used. A microprocessor 10 is connected by a bus 11 to a memory 13. Inside the microprocessor 10 are a number of clusters or logic blocks, such as clusters 12, 14, 16, 18 and 20. These clusters can be logic blocks, memory arrays, or other group circuitry. In-between the clusters are channels, such as channels 22, 24 and 26. The clusters would typically have drivers and receivers along their edges, such as driver/receiver arrays 28 and 30 on cluster 14 and driver/receiver arrays 32 and 34 on cluster 12. An example of a long line is shown as long line 40, which goes from a driver in array 30 to a receiver in array 38. A repeater 42 is placed in the middle of the line to speed the signal transition. As can be seen, the repeaters need to be placed typically after the rest of the circuitry has been laid out, and either need to be placed in the routing channels themselves, or in other locations.

FIG. 1B is a diagram of long line 40 connected between a driver 44 and a receiver 46. The driver, shown in simplified form, consists of a PMOS transistor 48 connected between line 40 and a positive voltage supply 50. An NMOS transistor 52 is connected between line 40 and ground 54.

Similarly, on the receiver, a PMOS transistor 56 is connected between an output line 58 and positive voltage supply 50. An NMOS transistor 60 is connected between output line 58 and ground 54. Please note that a positive voltage supply and ground are used only as examples, and other voltage levels could be used. Shown on the far left is an input signal A, and on the far right an output signal $\underline{A}$, indicating two inversions through the driver and receiver.

FIG. 1C illustrates the circuit of FIG. 1B with a repeater 42 added. The repeater includes a similar arrangement of a PMOS transistor 62 and an NMOS transistor 64. As illustrated by the signal and output line 58, the three bars over the A show that the signal has been inverted again, such that this output is the inverse of the input signal A.

FIG. 2 shows an alternate approach. Instead of a repeater which inverts, a keeper 66 is used. The keeper is a regenerative cross-coupled weak amplifier. The keeper will hold the wire's voltage at its initial setting until the wire's voltage reaches a trigger level, at which point the keeper creates positive feedback, taking the wire voltage to its compliance value, either VDD or GND.

SUMMARY OF THE INVENTION

The present invention provides a clamping circuit which is connected to each long line, preferably adjacent the receiver. The clamping circuit biases the long line at the trigger threshold of the receiver. Thus, instead of amplifying the signal as a repeater will do, the present invention clamps the line to the threshold, thus allowing a faster response since the line doesn't have to be charged or discharged from a lower or higher level to the threshold. This thus speeds up the transition at the receiver without requiring a repeater or a keeper.

The clamping circuit of the invention also reduces the node impedance at the receiver input, thus making the wire less susceptible to coupled interference from other signals.

In one embodiment, the clamping circuit is a feedback circuit. The node voltage can be sensed and converted into two currents fed back into the long line. The feedback circuit can take a variety of forms, and can be connected from the receiver output to its input, or from an intermediate point in the receiver to its input. In one embodiment, the feedback circuit is between two legs of a current mirror that forms a part of the receiver.

The present invention improves the noise margin while preserving the low impedance attributes of the long fine, thus giving more immunity to interference. Speed is enhanced because the voltage excursions are limited and the receiving end has low impedance.

For a further understanding of the nature and advantages of the invention, reference should be made to the following description taken in conjunction with the accompanying drawings.

BRIEF DESCRIPTION OF THE DRAWINGS

FIGS. 6A–6L are circuit diagrams of different embodiments of the feedback circuits of FIGS. 4A–5B.

DESCRIPTION OF THE SPECIFIC EMBODIMENTS

Figure 1A:
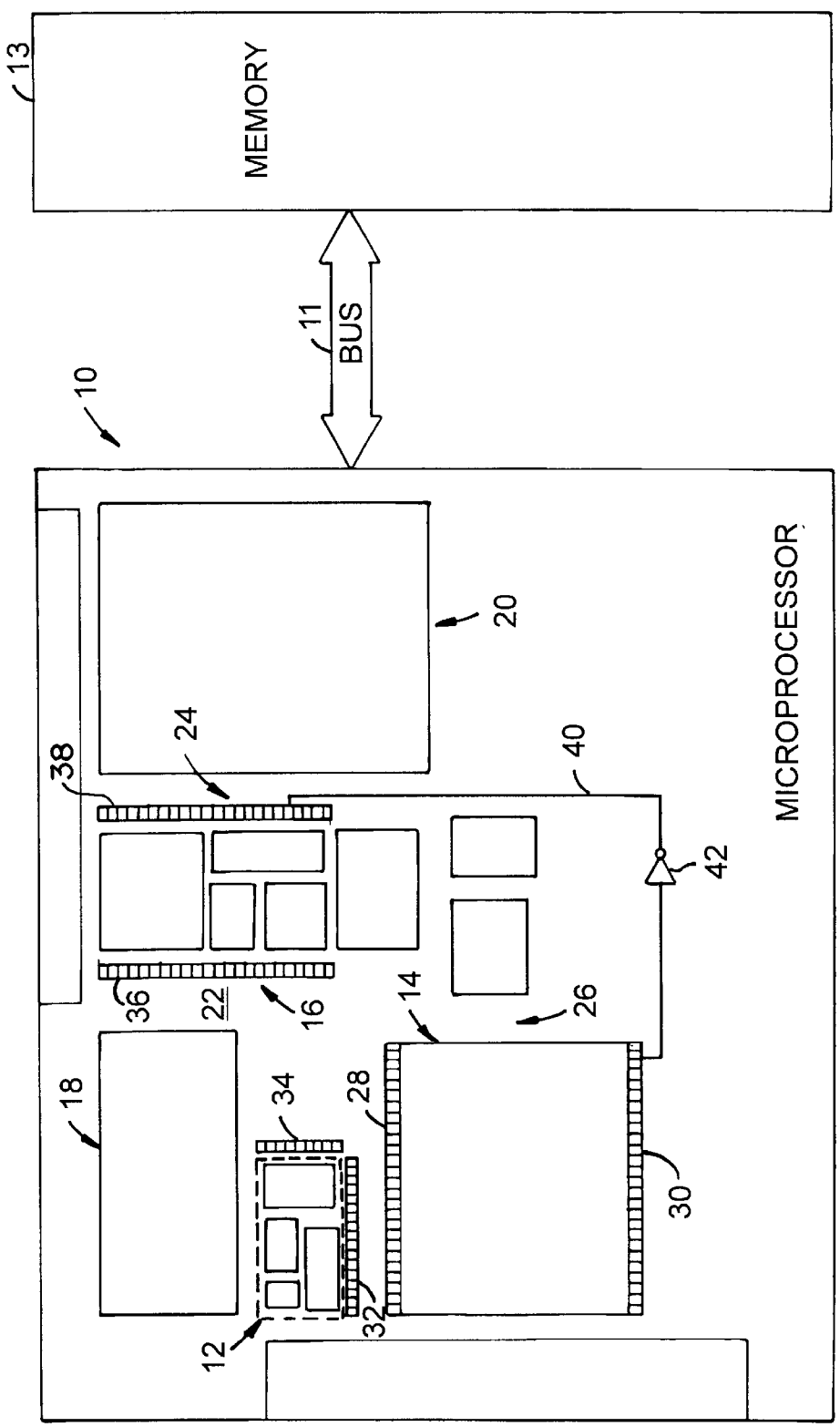
FIG. 1A is a block diagram of a prior art computer system illustrating long lines and repeaters.
Figure 1B:
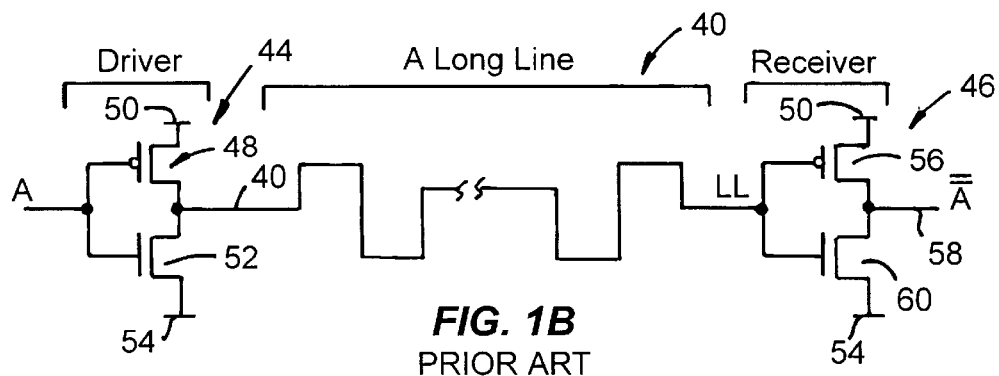
FIG. 1B is a circuit diagram of a prior art long line with a driver and receiver.
Figure 1C:
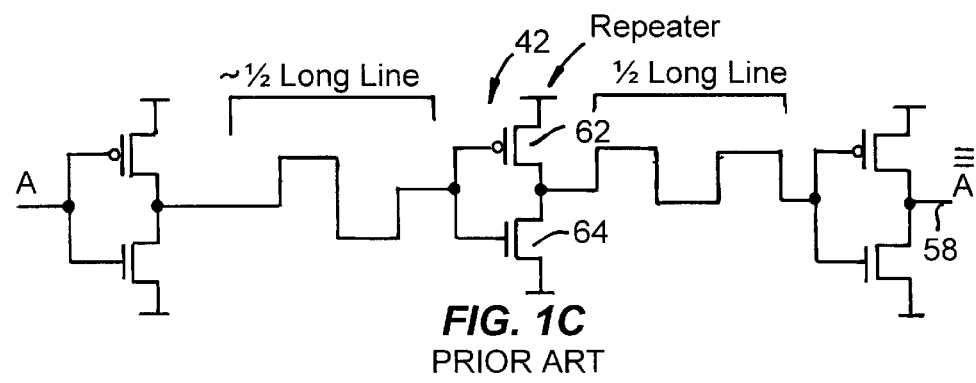
FIG. 1C is a diagram of the circuit of FIG. 1B with a repeater added.
Figure 2:
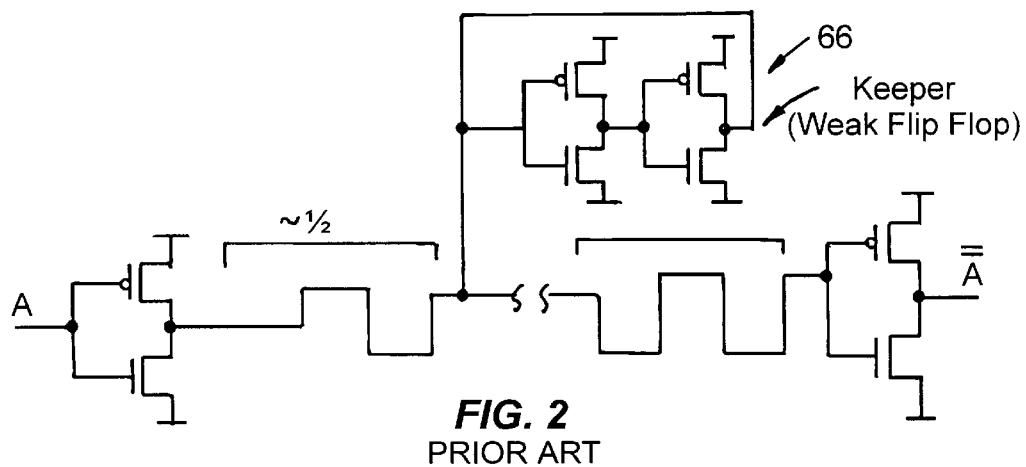
FIG. 2 is diagram of the circuit of FIG. 1B with a keeper added.
Figure 3:
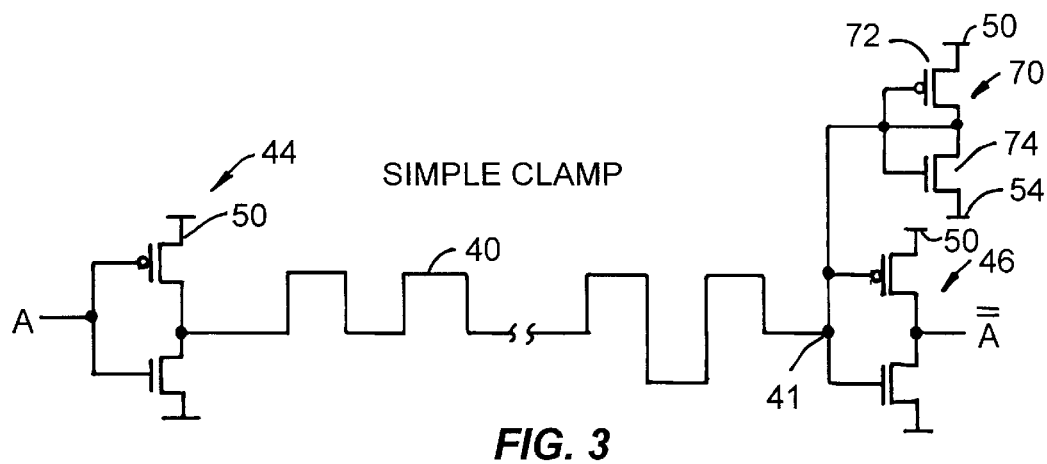
FIG. 3 is a circuit diagram illustrating a simple clamp according to one embodiment of the present invention.

FIG. 3 illustrates a driver 44, long line 40, and receiver 46 as in FIG. 1B. A clamping circuit 70 according to one embodiment of the invention is added. The clamping circuit consists of a PMOS transistor 72 connected as a diode. This diode is connected between voltage supply 50 and input node 41 to receiver 46. An NMOS transistor 74 is connected as a diode between ground 54 and node 41. The two diodes 72 and 74 are connected so that the cathode of PMOS diode 72 is connected to the anode of NMOS diode 74. In one embodiment, the supply voltage 50 is 2.5 volts and the voltage drop across the respective diodes is set to be 1.25 volts.

Figure 4A:
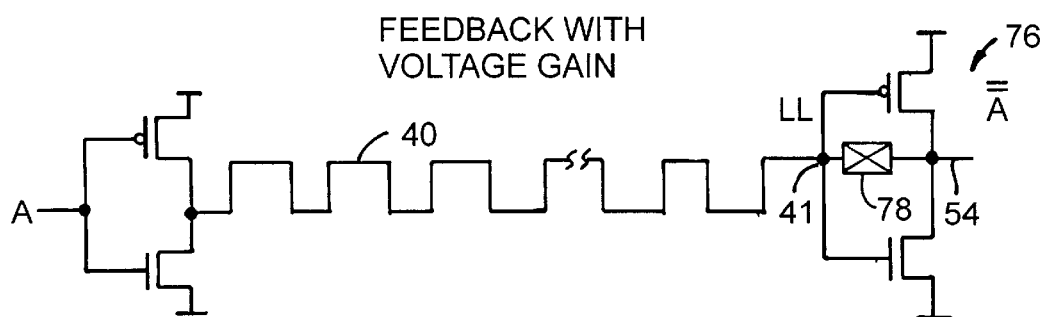
FIG. 4A is a circuit diagram illustrating feedback with current gain according to an embodiment of the invention.

FIG. 4A illustrates an alternate embodiment of the invention in which a feedback circuit 78 is included in a receiver circuit 76. The feedback circuit 78 connects between the output 54 of the receiver and the input 41. This clamping circuit feeds back from the output through the input with voltage amplification. The amplification is the characteristic gain of a CMOS inverter. Examples of clamping circuit 78 are set forth in FIGS. 6A–6L.

Figure 4B:
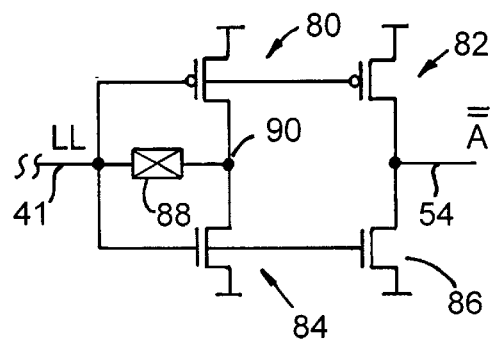
FIG. 4B is a circuit diagram of an alternate embodiment of the receiver circuit of FIG. 4A.

FIG. 4B is an alternate embodiment of the inverter 76 of FIG. 4A. In FIG. 4B, two PMOS transistors 80 and 82 are used, as well as two NMOS transistors 84 and 86. The clamping circuit 88 is connected between input node 41 and an intermediate node 90 between transistors 80 and 84.

Figure 5A:
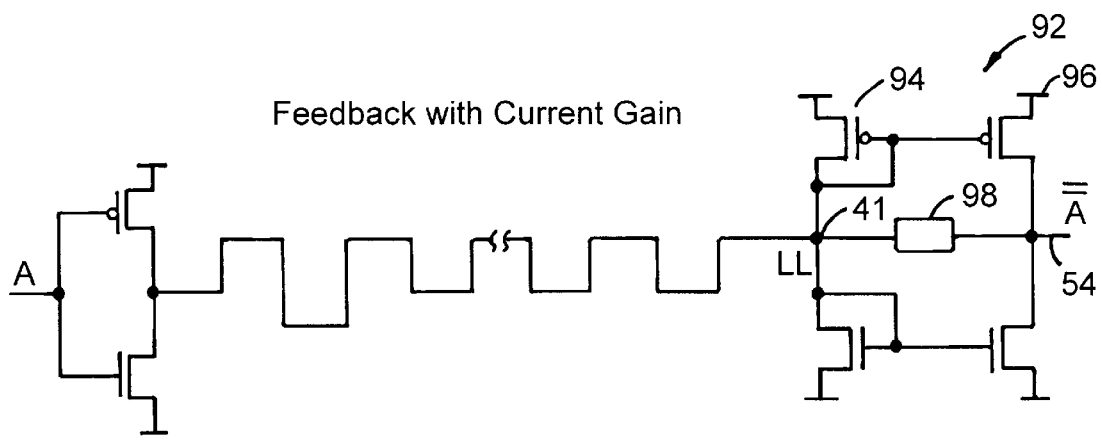
FIG. 5A is a circuit diagram of a feedback circuit with current gain according to an embodiment of the invention.

FIG. 5A is an alternate embodiment of the invention using a receiver circuit 92. In this circuit, PMOS transistors 94 and 96 are connected in a current mirror arrangement, with node 41 being one leg of the mirror, and output node 54 being the other leg of the current mirror. A feedback circuit 98 is connected between the two legs of the current mirror, and can take the form of any of the embodiments of FIGS. 6A–6L, or other forms. Based on the sizing of the transistors, the current mirror arrangement allows duplication of the current in one leg by a factor of K in the other leg. The feedback circuit 98 amplifies the current in the leg connected to node 41.

Figure 5B:
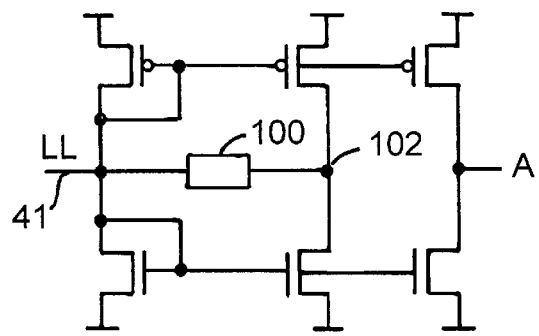
FIG. 5B is a circuit diagram of an alternate embodiment of the receiver of FIG. 5A.

FIG. 5B is an alternate configuration of the receiver of FIG. 5A. It is essentially a combination of the current mirror arrangement of FIG. 5A with the second stage of FIG. 4B. In FIG. 5B, the feedback circuit 100 is connected to an intermediate node 102, with another stage of PMOS and NMOS transistors added.

FIGS. 6A–6L show different embodiments of the feedback circuit used in the prior embodiments.

Figure 6A:
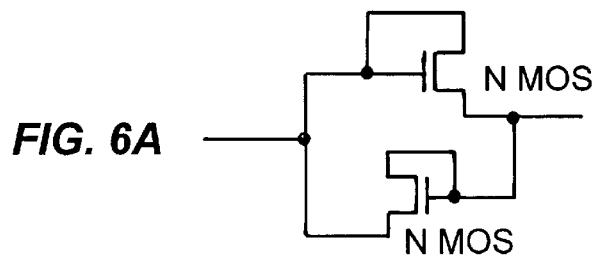

FIG. 6A illustrates two back-to-back NMOS diode-connected transistors.

Figure 6B:
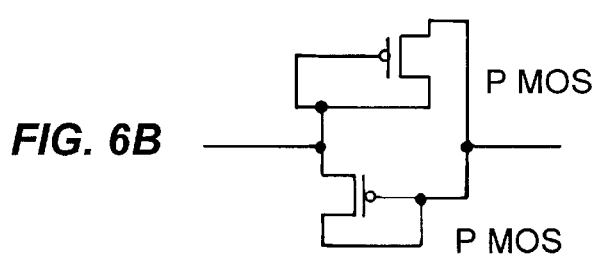

FIG. 6B illustrates two back-to-back PMOS diode-connected transistors.

FIGS. 6C and 6D are different arrangements of a combination of PMOS and NMOS transistors in a diode-connected configuration.

FIG. 6E illustrates the use of Schottky barrier diodes connected in parallel.

FIG. 6F illustrates the use of simple P-N junctions in reverse arrangement in parallel.

FIG. 6G illustrates the use of two vertical PNP bipolar transistors as a feedback circuit.

FIG. 6H illustrates the use of two NPN bipolar transistors for the feedback circuit, connected in a diode arrangement.

FIG. 6I illustrates two PNP transistors connected in a diode arrangement.

FIG. 6J illustrates an NMOS transistor center biased by a bias voltage. Typically, the bias voltage would be 1.25+VTN (VTN is typically 0.8 volts) for a 2.5 volt chip.

FIG. 6K is similar to FIG. 6J with a PMOS transistor.

FIG. 6L shows the use of two parallel and complementary center bias transistors, one being NMOS and the other being PMOS.

As will be understood by those of skill in the art, the present invention may be embodied in other specific forms without departing from the essential characteristics thereof. For example, instead of the clamping circuit being connected right at the input of the receiver, it could be some distance from the receiver, and even could be at the midpoint of the long line between the driver and receiver. In addition, although exemplary clamping circuits have been shown here, other clamping circuits could be devised to accomplish the function of the present invention. Accordingly, the foregoing description is intended to be illustrative, but not limiting, of the scope of the invention which is set forth in the following claims.

What is claimed is:

1. An integrated circuit comprising:
   a driver having an output;
   a line coupled to said output of said driver;
   a receiver having an input coupled to said line, said receiver including a current mirror;
   a clamping circuit coupled to said line, said clamping circuit reducing the delay at said receiver in signal transitions from said driver over said line, said clamping circuit comprising a feedback circuit coupled between said input of said receiver and a receiver node beyond said input; and
   said feedback circuit being coupled between two legs of said current mirror, one of said legs being said input of said receiver.

2. An integrated circuit comprising:
   a driver having an output;
   a line coupled to said output of said driver;
   a receiver having an input coupled to said line; and
   a clamping circuit coupled to said line adjacent said receiver within a circuit block containing said receiver, said clamping circuit reducing the delay at said receiver in signal transitions from said driver over said line, wherein said clamping circuit clamps a voltage on said line at a trigger threshold of said input of said receiver in the absence of an input signal.

3. The integrated circuit of claim 2 wherein said clamping circuit is adjacent said input of said receiver.

4. The integrated circuit of claim 3 wherein said clamping circuit is within a circuit block containing said receiver.

5. The integrated circuit of claim 2 wherein said clamping circuit comprises:
   a first diode-connected transistor coupled between said line and a supply voltage; and
   a second diode-connected transistor coupled between said line and ground.

6. The integrated circuit of claim 2 wherein said clamping circuit comprises:
   a feedback circuit coupled between said input of said receiver and a receiver node beyond said input.

7. The integrated circuit of claim 6 wherein said feedback circuit is coupled to an output of said receiver.

8. An integrated circuit comprising:
   a driver having an output;
   a line coupled to said output of said driver;
   a receiver having an input coupled to said line; and
   a clamping circuit coupled to said line adjacent said receiver within a circuit block containing said receiver, said clamping circuit reducing the delay at said receiver in signal transitions from said driver over said line, wherein said clamping circuit clamps a voltage on said line at a trigger threshold of said input of said receiver in the absence of an input signal;
   wherein said clamping circuit includes a feedback circuit coupled between said input of said receiver and a receiver node beyond said input.

9. A computer system comprising:
   a memory;
   a bus connected to said memory; and
   a microprocessor connected to said bus, said microprocessor including:
   a driver having an output;
   a line coupled to said output of said driver;
   a receiver having an input coupled to said line; and
   a clamping circuit coupled to said line, said clamping circuit reducing the delay at said receiver in signal transitions from said driver over said line, wherein said clamping circuit clamps a voltage on said line at a trigger threshold of said input of said receiver in the absence of an input signal.

10. A method of making an integrated circuit comprising:

providing a driver having an output;

laying out a line coupled to said output of said driver;

providing a receiver having an input coupled to said line; and inserting a clamping circuit coupled to said line adjacent said receiver within a circuit block containing said receiver, said clamping circuit reducing the delay at said receiver in signal transitions from said driver over said line, wherein said clamping circuit clamps a voltage on said line at a trigger threshold of said input of said receiver in the absence of an input signal.

11. A method of operating an integrated circuit comprising:
   driving an output signal onto a line;
   receiving said output signal at a receiver having an input coupled to said line; and
   clamping a voltage on said line at a trigger threshold of said input of said receiver in the absence of an input signal with a clamping circuit coupled to said line, thereby reducing the delay at said receiver in signal transitions from said driver over said line.

* * * * *